United States Patent
Byeon

(10) Patent No.: US 7,773,432 B2
(45) Date of Patent: Aug. 10, 2010

(54) SEMICONDUCTOR MEMORY DEVICE WITH NORMAL AND OVER-DRIVE OPERATIONS

(75) Inventor: Sang Jin Byeon, Gyeonggi-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 123 days.

(21) Appl. No.: 12/118,810

(22) Filed: May 12, 2008

(65) Prior Publication Data
US 2009/0067264 A1    Mar. 12, 2009

(30) Foreign Application Priority Data
Sep. 10, 2007    (KR) .................. 10-2007-0091765

(51) Int. Cl.
*G11C 7/00* (2006.01)
*G11C 5/14* (2006.01)

(52) U.S. Cl. .................. 365/189.11; 365/189.09; 365/203; 365/226; 327/530; 327/538

(58) Field of Classification Search ............. 365/189.11
See application file for complete search history.

(56) References Cited

U.S. PATENT DOCUMENTS

| | | | | |
|---|---|---|---|---|
| 5,258,956 A | * | 11/1993 | Ahn et al. | 365/204 |
| 5,544,110 A | * | 8/1996 | Yuh | 365/205 |
| 6,717,880 B2 | * | 4/2004 | Jeong | 365/189.07 |
| 6,778,460 B1 | * | 8/2004 | Jung | 365/227 |
| 6,853,593 B1 | * | 2/2005 | Bae | 365/189.09 |
| 7,317,642 B2 | * | 1/2008 | Hirobe | 365/189.011 |
| 7,362,631 B2 | * | 4/2008 | Jang | 365/201 |
| 7,417,903 B2 | * | 8/2008 | Kim et al. | 365/189.09 |
| 7,446,577 B2 | * | 11/2008 | Kim et al. | 327/109 |
| 7,447,100 B2 | * | 11/2008 | Jang | 365/226 |
| 7,515,492 B2 | * | 4/2009 | Seo | 365/205 |
| 7,580,306 B2 | * | 8/2009 | Cho | 365/210.12 |
| 7,583,547 B2 | * | 9/2009 | Jang et al. | 365/205 |
| 7,613,059 B2 | * | 11/2009 | Kang | 365/207 |
| 2005/0024129 A1 | * | 2/2005 | Jang | 327/541 |

FOREIGN PATENT DOCUMENTS

| | | |
|---|---|---|
| KR | 2005-0105587 A | 11/2005 |
| KR | 10-0652796 B1 | 11/2006 |
| KR | 2007-0036634 A | 4/2007 |

* cited by examiner

*Primary Examiner*—Son L Mai
(74) *Attorney, Agent, or Firm*—Ladas & Parry LLP

(57) ABSTRACT

A semiconductor memory device having a driver configured to sequentially perform over-driving and normal driving operations is presented. The semiconductor memory device includes a driver that outputs a drive signal, that over-drives the drive signal with an over-drive voltage having a voltage level higher than a normal drive voltage, and then subsequently normally drives the drive signal with the normal drive voltage. The semiconductor memory device also includes a drive voltage adjuster that detects a level of the over-drive voltage and compensates for a change in the voltage level of the normal drive voltage in response to the detected level of the over-drive voltage.

29 Claims, 9 Drawing Sheets

(a)

(b)

SEMICONDUCTOR MEMORY DEVICE WITH NORMAL AND OVER-DRIVE OPERATIONS

CROSS-REFERENCE TO RELATED APPLICATIONS

The present application claims priority to Korean patent application number 10-2007-0091765 filed on Sep. 10, 2007, which is incorporated herein by reference in its entirety.

BACKGROUND OF THE INVENTION

The present invention relates to a semiconductor memory device, and more precisely to a semiconductor memory device including a driver sequentially performing over-driving and normal driving operations.

In general, in a semiconductor memory device, when it is necessary to raise a predetermined node to a target level as quickly as possible, a method of over-driving the node higher than the target level in an initial operation is often used.

As an example, a sensing amplifier sensing a bit line pair amplifies the bit line pair with drive voltages respectively supplied from a pull-up drive node and a pull-down drive node. Conventionally, in order to rapidly sense and amplify a bit line pair, a voltage of a level higher than a core voltage VCORE, e.g., a power voltage VDD, is initially supplied to a pull-up drive node to be over-driven, and the core voltage VCORE is supplied to the pull-up drive node after the bit line pair are sufficiently sensed. That is, the pull-up drive node of the sensing amplifier is initially connected to a power voltage VDD terminal and then connected to a core voltage VCORE terminal after a predetermined time.

However, as a current that previously flowed at the power voltage VDD terminal flows into the core voltage VCORE terminal when the pull-up drive node is connected to the core voltage VCORE, the level of the core voltage VCORE may be raised.

The level rising of a core voltage VCORE due to such over-driving will be described with reference to FIG. 1. A sensing and amplifying operation of a bit line pair may be divided into an over-driving interval 'A' at which a power voltage VDD is supplied to a pull-up drive node and a normal driving interval 'B' at which a core voltage VCORE is supplied to the pull-up drive node.

At this time, due to the power voltage VDD applied to the pull-up drive node, the level of the core voltage VCORE may be raised higher by ΔV1 than a target value at the time when normal driving is started. In order to prevent leakage of a transistor or stabilize a level of the core voltage VCORE, the raised core voltage VCORE may be discharged through a transistor with a very small size. However, its discharge effect is extremely insignificant, and therefore, discharge is made by ΔV2 smaller than ΔV1. As a result, the level of the core voltage VCORE may be practically maintained as a level higher than the target value.

In order to solve such a problem, there has been suggested a structure in which a conventional discharge circuit forcibly dropping a core voltage VCORE to a target level after over-driving is connected to an output terminal of a core voltage driver.

That is, the conventional discharge circuit includes a pull-down transistor connected to the output terminal of the core voltage driver. When a core voltage VCORE is higher than a target voltage, comparing the core voltage with the target voltage during a predetermined time after over-driving, the core voltage VCORE is discharged using the pull-down transistor.

However, in the conventional discharge circuit having such a configuration, since the discharge amount of the core voltage VCORE is determined depending on the size of the pull-down transistor, it is difficult to uniformly maintain the core voltage VCORE as the target level.

That is, as shown in (a) of FIG. 2, when the size of the pull-down transistor is large, the core voltage is excessively discharged, and thus, the level of the core voltage VCORE may fall lower than a target core voltage Target VCORE. In this case, since the core voltage driver again raises the level of the core voltage VCORE in order to set the core voltage VCORE to a target level, a ringing phenomenon may occur, in which the level of the core voltage VCORE oscillates during a discharge interval 'C' at which the discharge circuit is operated after over-driving. Current consumption may also be increased.

On the other hand, when the size of the pull-down transistor is small as shown (b) of FIG. 2, the core voltage VCORE is not sufficiently discharged, and therefore, the level of the core voltage VCORE may be maintained higher than the target level.

These problems may be improved through size tuning of the pull-down transistor, discharge time tuning of the core voltage and response speed tuning of the discharge circuit in failure analysis, which may result in increased time and costs.

The aforementioned problems frequently occur because an amount of over-driving current is changed corresponding to the level fluctuation of a power voltage VDD.

That is, if the level of the power voltage VDD raises, the amount of over-driving current increases, and if the level of the power voltage VDD falls, the amount of over-driving current decreases. However, in the conventional discharge circuit, the discharge amount of the core voltage VCORE is fixed. For this reason, if the discharge amount is relatively small when the level of the power voltage VDD rises, the level of the core voltage VCORE may rise higher than the target level. If the discharge amount is relatively large when the level of the power voltage VDD falls, the level of the core voltage VCORE may fall lower than the target level.

As described above, when the level of a core voltage VCORE is changed corresponding to the level fluctuation of a power voltage VDD, reliability of a circuit using the core voltage VCORE may be lowered.

SUMMARY OF THE INVENTION

There is provided a semiconductor memory device capable of preventing level fluctuation of a normal drive voltage due to over-driving.

There is also provided a semiconductor memory device capable of maintaining a predetermined node as a target level of normal driving during a normal driving interval after over-driving at the node.

There is also provided a semiconductor memory device capable of reducing time and costs due to the level adjustment of the normal drive voltage by appropriately discharging a level increment of the normal drive voltage due to over-driving.

There is also provided a semiconductor memory device capable of preventing a normal drive voltage from being fluctuated due to an over-drive voltage when the over-drive voltage and the normal drive voltage are sequentially supplied to a pull-up driving node of a sensing amplifier sensing and amplifying a bit line pair, thereby securing reliability of a pull-up operation of the sensing amplifier.

There is provided a semiconductor memory device according to one embodiment of the present invention which includes: a driver outputting a drive signal, over-driving the drive signal with an over-drive voltage having a level higher than a normal drive voltage and then subsequently normal driving the drive signal with the normal drive voltage; and a drive voltage adjuster detecting a level of the over-drive voltage and compensating for a change in the level of the normal drive voltage due to the over-driving with the detected result.

Preferably, the drive voltage adjuster discharges the normal drive voltage with the result obtained by detecting the level of the over-drive voltage in the normal driving to compensate for the change in the level of the normal drive voltage.

Preferably, the drive voltage adjuster adjusts a discharge time of the normal drive voltage corresponding to the result obtained by detecting the level of the over-drive voltage.

Preferably, the drive voltage adjuster previously sets a plurality of discharge intervals corresponding to various reference levels, detects a level of the normal drive voltage to select the discharge interval corresponding to the level of the normal drive voltage, and then discharges the normal drive voltage during the selected discharge interval.

Preferably, the normal drive voltage is an internal voltage, and the over-drive voltage is an external voltage. Preferably, the internal voltage is a core voltage, and the external voltage is a power voltage.

Preferably, the drive signal outputted from the driver is provided to a pull-up drive node of a sensing amplifier sensing and amplifying a potential difference between a bit line pair.

There is a provided a semiconductor memory device according to another embodiment of the present invention which includes: a driver outputting a drive signal, and over-driving the drive signal with an over-drive voltage having a level higher than a normal drive voltage and then normal driving the drive signal with the normal drive voltage; a discharge interval setting unit detecting the level of the over-drive voltage to output a discharge enable signal having an enable interval corresponding to the detected result with a normal drive interval; and a discharge unit selectively discharging the normal drive voltage to adjust the normal drive voltage as a target level during the enable interval of the discharge enable signal.

Preferably, the discharge interval setting unit outputs the discharge enable signal having a first enable interval when the detected over-drive voltage is a first level, outputs the discharge enable signal having an interval broader than the first enable interval when the detected over-drive voltage is higher than the first level, and outputs the discharge enable signal having an interval narrower than the first enable interval when the detected over-drive voltage is lower than the first level.

Preferably, the discharge interval setting unit includes: a voltage detector detecting a level of the over-drive voltage; a pulse generator generating pulses having different enable intervals within a normal driving interval; and a pulse selector selecting any one of the pulses corresponding to the detected level of the over-drive voltage to be outputted as the discharge enable signal.

Preferably, the voltage detector detects and divides the level of the over-drive voltage for each interval to output a plurality of detection signals corresponding to the respective intervals, and enables and outputs a detection signal corresponding to the interval at which the level of the over-drive voltage is formed among the plurality of detection signals.

Preferably, the pulse generator generates the plurality of pulses using a normal drive enable signal controlling enable of the normal driving.

Preferably, the pulse selector selects a first pulse of the plurality of pulses to be outputted as the discharge enable signal when the detected over-drive voltage is a first voltage level, selects a second pulse having an enable interval broader than the first pulse of the plurality of the pulses to be outputted as the discharge enable signal when the detected over-drive voltage is higher than the first level, and selects a third pulse having an enable interval narrower than the first pulse of the plurality of pulses to be outputted as the discharge enable signal when the detected over-drive voltage is lower than the first level.

Preferably, the discharge unit compares the normal drive voltage with the target level while the discharge enable signal is enabled, and discharges the normal drive voltage up to the target level when the level of the normal drive voltage is higher than the target level.

Preferably, the discharge unit includes: a comparator comparing the normal drive voltage with a normal drive reference voltage having the target level to be outputted as a control signal having a state corresponding to the compared result while the discharge enable signal is enabled; and a pull-down unit selectively pulling down the normal drive voltage depending on a state of the control signal.

Preferably, the normal drive voltage is an internal voltage, and the over-drive voltage is an external voltage. Preferably, the internal voltage is a core voltage, and the external voltage is a power voltage.

Preferably, the drive signal outputted from the driver is provided to a pull-up drive node of a sensing amplifier sensing and amplifying a potential difference between a bit line pair.

There is provided a semiconductor memory device according to still another embodiment of the present invention which includes: a driver outputting a drive signal, and over-driving the drive signal with an over-drive voltage having a level higher than a normal drive voltage and then normal driving the drive signal with the normal drive voltage; a voltage detector detecting a level of the over-drive voltage; and a discharge controller setting a discharge interval corresponding to the detected level of the over-drive voltage and selectively discharging the normal drive voltage during the set discharge interval to adjust the normal drive voltage to a target level.

Preferably, the voltage detector compares the over-drive voltage with an over-drive reference voltage having a target level of the over-drive voltage to detect the level of the over-drive voltage.

Preferably, the voltage detector includes: a divider dividing the level of the over-drive voltage; and a comparator comparing the divided voltage with an over-drive reference voltage having a target level of the divided voltage to be outputted as the detection signal having information on the level of the divided voltage.

Preferably, the discharge controller includes: a pulse generator generating a plurality of pulses having different enable intervals within the normal driving interval; a pulse selector selecting any one of the plurality of pulses with the detection signal to be outputted as the discharge enable signal; and a discharge unit selectively discharging the normal drive voltage to adjust the normal drive voltage to the target level during the enable interval of the discharge enable signal.

Preferably, the pulse generator generates the plurality of pulses using a normal drive enable signal controlling enable of the normal driving.

Preferably, the pulse selector selects a first pulse of the plurality of the pulses when the detection signal has information on the over-drive voltage having a first level, selects a second pulse having an enable interval broader than the first pulse of the plurality of the pulses when the detecting signal has information on the over-drive voltage higher than the first level, and selects a third pulse having an enable interval narrower than the first pulse of the plurality of pulses when the detection signal has information on the over-drive voltage lower than the first level.

Preferably, the discharge unit compares the normal drive voltage with the target level while the discharge enable signal is enabled, and discharges the normal drive voltage up to the target level when the level of the normal drive voltage is higher than the target level.

Preferably, the discharge unit includes: a comparator comparing the normal drive voltage with a normal drive reference voltage having the target level to be outputted as a control signal having a state corresponding to the compared result while the discharge enable signal is enabled; and a pull-down unit selectively pulling down the normal drive voltage depending on a state of the control signal.

Preferably, the normal drive voltage is an internal voltage, and the over-drive voltage is an external power voltage. Preferably, the normal drive voltage is a core voltage, and the over-drive voltage is a power voltage.

Preferably, the drive signal outputted from the driver is provided to a pull-up drive node of a sensing amplifier sensing and amplifying a potential difference between a bit line pair.

DESCRIPTION OF SPECIFIC EMBODIMENTS

Hereinafter, preferred embodiments of the present invention will be described in detail with reference to the accompanying drawings.

The present invention has a configuration in which, when over-driving and normal driving are consecutively performed, the discharge amount of a normal drive voltage is appropriately adjusted depending on the voltage level of an over-drive voltage by sensing the over-drive voltage, so that the normal drive voltage can be maintained as a target level at a normal driving interval.

Figure 1:
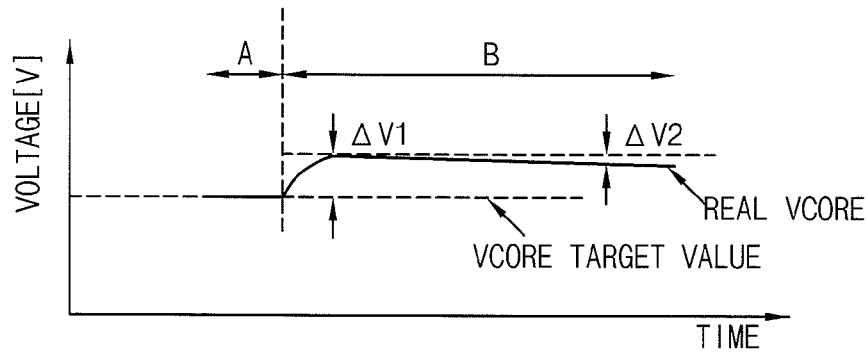
FIG. 1 is a waveform diagram illustrating a level rising of a core voltage VCORE due to over-driving of pull-up drive node RTO in a conventional semiconductor memory device.
Figure 2:
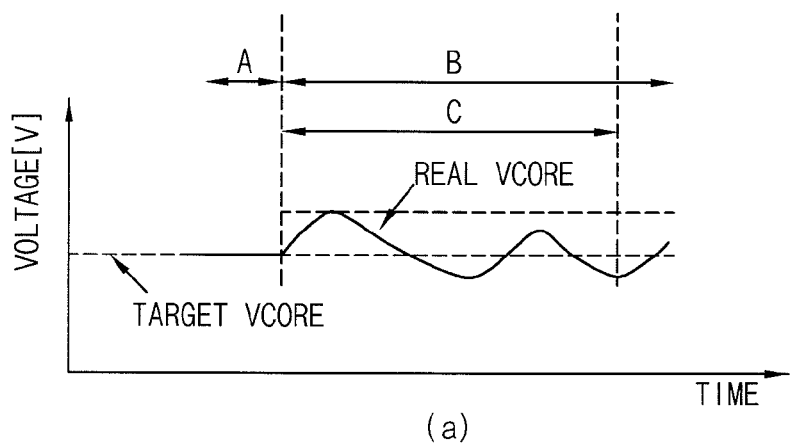
FIG. 2 is a waveform diagram illustrating level fluctuation of a core voltage VCORE due to a discharge circuit after the over-driving of pull-up drive node RTO in a conventional semiconductor memory device.
Figure 2:
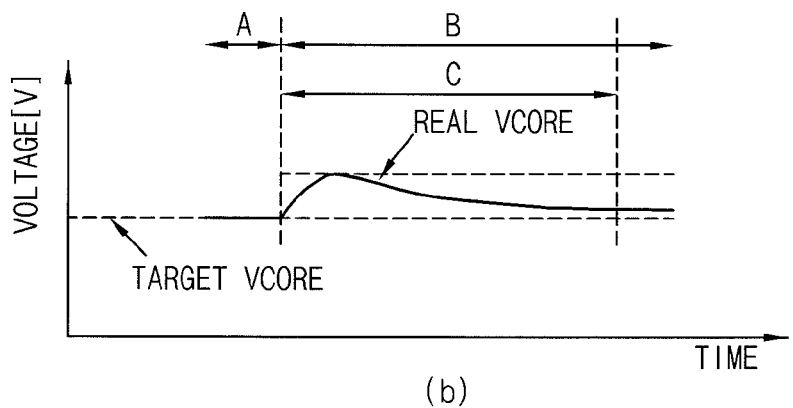
Figure 3:
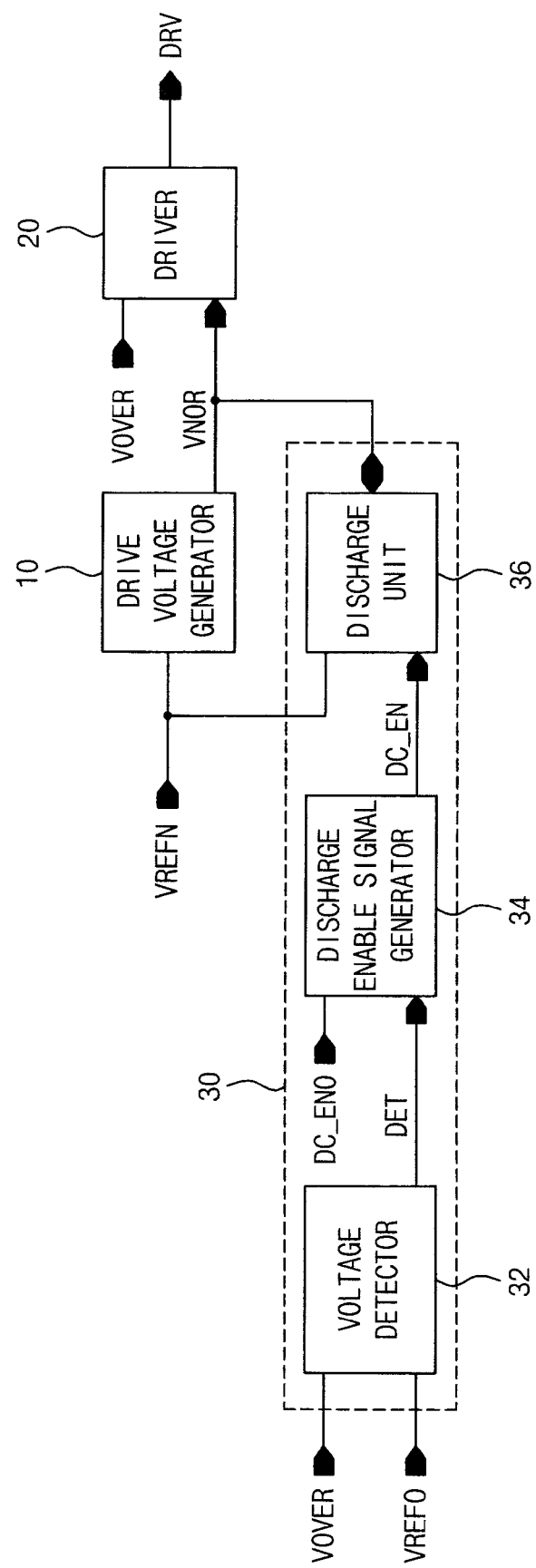
FIG. 3 is a block diagram showing an embodiment of a semiconductor memory device according to the present invention.

Specifically, referring to FIG. 3, a semiconductor memory device according to the present invention includes a drive voltage generator 10, a driver 20 and a drive voltage adjuster 30.

The drive voltage generator 10 generates a normal drive voltage VNOR corresponding to a reference voltage VREFN using the reference voltage VREFN having a target level of normal driving. Here, the normal drive voltage VNOR is an internal voltage, which may correspond to a core voltage VCORE.

Figure 4A:
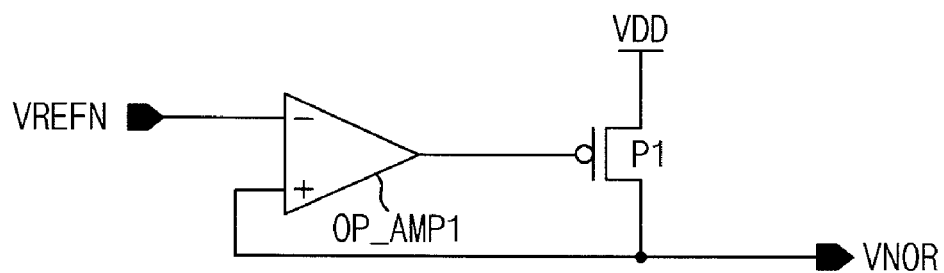
FIGS. 4a and 4b are circuit diagrams showing various embodiments of a drive voltage generator 10 of FIG. 3.

As an example, as shown in FIG. 4a, the drive voltage generator 10 may include an operational amplifier OP-AMP1 receiving a normal drive reference voltage VREFN inputted to an inverting input terminal and receiving a normal drive voltage VNOR inputted to a non-inverting input terminal to compare the normal drive reference voltage VREFN with the normal drive voltage VNOR, and a PMOS transistor P1 for raising a normal drive voltage VNOR to a power voltage VDD level in response to an output of the operational amplifier OP-AMP1.

Figure 4B:
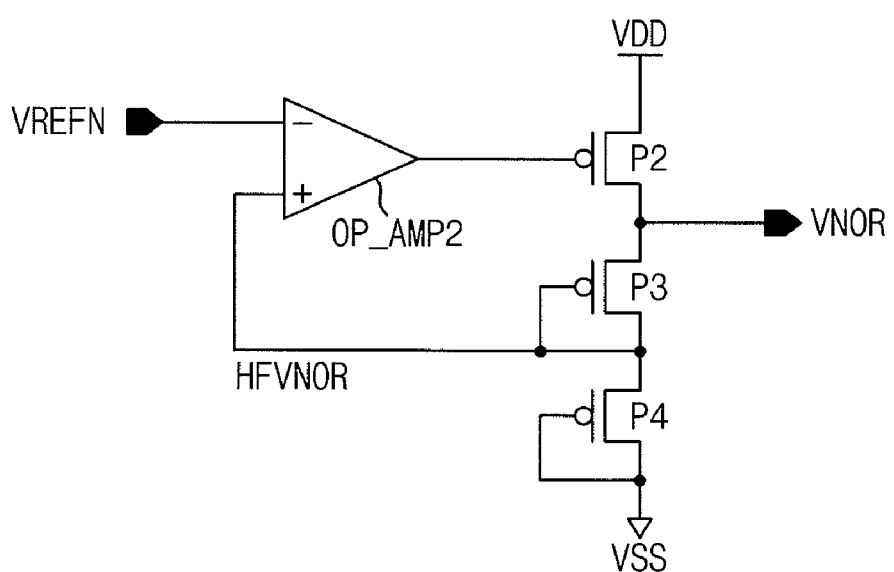

As another example, as shown in FIG. 4b, the drive voltage generator 10 may include an operational amplifier OP-AMP2 receiving a normal drive reference voltage VREFN inputted to an inverting input terminal and receiving a half normal drive voltage HFVNOR, which has a level corresponding to a half of the level of a normal drive voltage VNOR, inputted to a non-inverting input terminal to compare the normal drive reference voltage VREFN with the half normal drive voltage HFVNOR; a PMOS transistor P2 raising a normal drive voltage VNOR to a power voltage VDD level in response to an output of the operational amplifier OP-AMP2; and two PMOS-transistor-type diodes P3, P4 each dividing a normal drive voltage VNOR to be outputted as a half normal drive voltage HFVNOR. Here, the normal drive reference voltage VREFN corresponds to a target level of the half normal drive voltage HFVNOR.

Referring back to FIG. 3, the driver 20 outputs a driving signal DRV. The driver 20 over-drives the driving signal DRV with an over-drive voltage VOVER having a level higher than a normal drive voltage VNOR, and normal-drives the driving signal DRV with the normal drive voltage VNOR after a predetermined time. Here, an external voltage or an internal voltage generated using the external voltage may be used as the over-drive voltage VOVER. As an example, when the normal drive voltage VNOR is a core voltage VCORE, an external power voltage VDD or an internal voltage having a level higher than the core voltage VCORE may be used the over-drive voltage VOVER.

Although not shown in FIG. 3, the driver 20 may include a first pull-up transistor pulling up a driving signal DRV to an over-drive voltage VOVER during an over driving interval, and a second pull-up transistor pulling up a driving signal DRV to a normal drive voltage VNOR during a normal driving interval.

The drive voltage adjuster 30 detects the level of an over-drive voltage VOVER to compensate for a change in the level of a normal drive voltage VNOR due to the previous over-driving in normal driving.

The drive voltage adjuster 30 may have a configuration in which the level of an over-drive voltage VOVER is detected, and a normal drive voltage VNOR is discharged to correspond to the detected result during a normal driving operation, so that the normal drive voltage VNOR is adjusted to correspond to the level of a normal drive reference voltage VREFN.

As an example, the drive voltage adjuster 30 may include a discharge interval setting unit detecting the level of an over-drive voltage VOVER to output a discharge enable signal DC_EN having an enable interval corresponding to the detected result within a normal driving interval, and a discharge unit 36 controlling the discharge of a normal drive voltage VNOR during an enable interval of the discharge enable signal DC_EN to adjust the normal drive voltage VNOR to a target level. Here, the discharge interval setting unit may include a voltage detector 32 and a discharge enable signal generator 34.

As another example, the drive voltage adjuster 30 may include a voltage detector 32 detecting the level of an over-drive voltage VOVER, and a discharge controller setting a discharge interval corresponding to the detected voltage level and controlling the discharge of a normal drive voltage VNOR during the discharge interval to adjust the normal drive voltage VNOR to a target level. Here, the discharge controller may include a discharge enable signal generator 34 and a discharge unit 36.

The voltage detector 32 detects the level of an over-drive voltage VOVER to output a detection signal DET. As an example, the voltage detector 32 may have a configuration in which an over-drive voltage VOVER is compared with an over-drive reference voltage VREFO having a target level of the over-drive voltage VOVER to output a detection signal DET having a state corresponding to the compared result.

Figure 5:
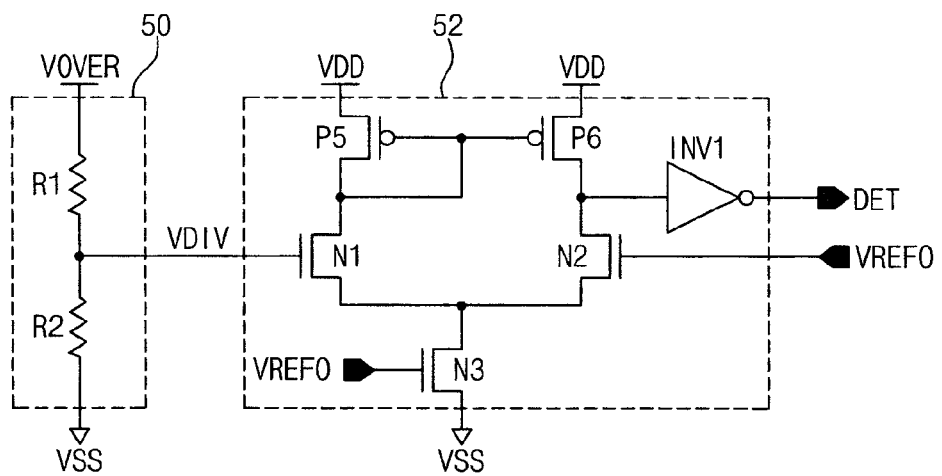
FIG. 5 is a circuit diagram showing an embodiment of a voltage detector 32 of FIG. 3.

As another example, as shown in FIG. 5, the voltage detector 32 includes a divider 50 dividing the level of an over drive voltage VOVER, and a comparator 52 comparing a voltage VDIV divided by the divider 50 with an over-drive reference signal VREFO having a level corresponding to a half of the over-drive voltage VOVER to output a detection signal DET having a state corresponding to the compared result.

Here, the divider 50 includes two resistors R1, R2 connected in series between an over-drive voltage VOVER terminal and a ground voltage VSS terminal, and the divided voltage VDIV divided through a node connected between the two resistors R1, R2 may be outputted.

The comparator 52 may include two PMOS transistors P5, P6 with a current mirror structure; two NMOS transistors N1, N2 with a differential pair structure, respectively connected to the PMOS transistors P5, P6 and respectively receiving the divided voltage VDIV and an over-drive reference voltage VREFO; an NMOS transistor N3 supplying a bias current to the two NMOS transistors N1, N2 in response to the over-drive reference voltage VREFO; and an inverter INV1 inverting a signal outputted through a node connected between the PMOS transistor P6 and the NMOS transistor N2 to output a detection signal DET. Here, two PMOS transistors P5, P6 are connected between power voltage VDD terminals and the NMOS transistors N1, N2, respectively, and a gate is commonly connected between the PMOS transistor P5 and the NMOS transistor N1. The NMOS transistor N3 is connected between the two NMOS transistors N1, N2 and a ground voltage VSS terminal.

The voltage detector 32 including the divider 50 and the comparator 52 has a configuration in which a transition time of the detection signal DET is determined depending on the resistance ratio of the two resistors R1, R2 provided to the divider 50. In order to detect the level of the over-drive voltage VOVER more precisely, a plurality of voltage detectors 32, resistance ratios of which are set to be different, may be provided.

Figure 6:
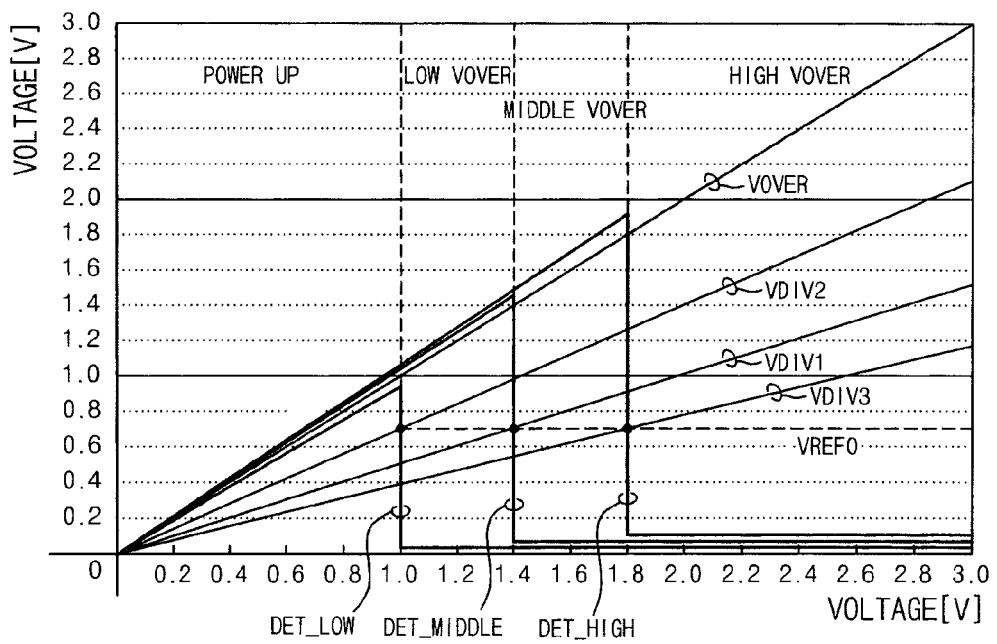
FIG. 6 is a waveform diagram showing results of over-drive voltages VOVER detected by three voltage detectors 32, resistance ratios of which are set to be different in the same configuration as FIG. 5.

For example, three voltage detectors 32, resistance ratios of which are set to be different in the same configuration, may be suggested. As shown in FIG. 6, when the level of a divided voltage VDIV1 corresponds to the level of an over-drive reference voltage VREFO, a first voltage detector 32 enables and outputs a detection signal DET_MIDDLE.

With respect to the voltage VDIV1 divided in the first voltage detector 32, a second voltage detector 32 enables and outputs a detection signal DET_LOW when the level of a divided voltage VDIV2 is lower than the level of the voltage VDIV1, and a third voltage detector 32 enables and outputs a detection signal DET_HIGH when the level of divided voltage VDIV3 is higher than the level of the VDIV1.

That is, when an over-drive voltage VOVER exists at a power-up 'POWER UP' interval, the detection signals DET_LOW, DET_MIDDLE, DET_HIGH are all outputted as a high level (here, the high level means a disable state), and when the over-drive voltage VOVER is formed within a low level 'LOW VOVER' interval, the detection signal DET_LOW is outputted as a low level (here, the low level means an enable state).

When the over-drive voltage VOVER is formed within a middle level 'MIDDLE VOVER' interval, the detection signal DET_MIDDLE is outputted as a low level, and when the over-drive voltage VOVER is formed within a high level 'HIGH VOVER' interval, the detection signal DET_HIGH is outputted as a low level.

As described above, when the three voltage detectors 32 are provided, the over-drive voltage VOVER may be detected as any one of the power-up state 'POWER UP', the low level state 'LOW VOVER', the middle level state 'MIDDLE VOVER' and the high level state 'HIGH VOVER' through the detection signals DET_LOW, DET_MIDDLE, DET_HIGH outputted from the respective voltage detectors 32.

Figure 7:
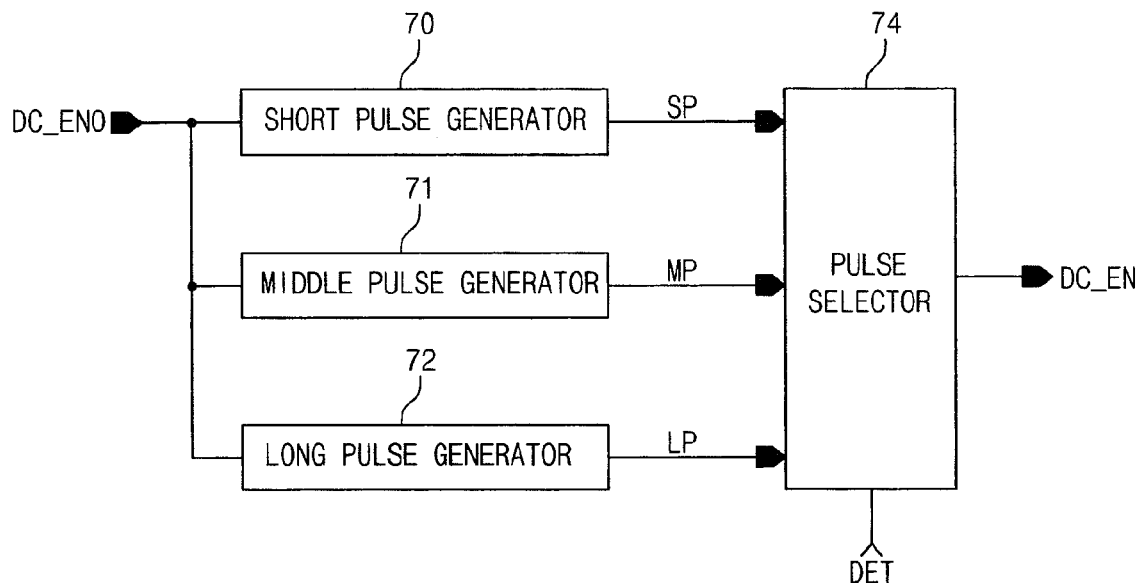
FIG. 7 is a block diagram showing an embodiment of a discharge enable signal generator 34 of FIG. 3.

As shown in FIG. 7, the discharge enable signal generator 34 may include pulse generators 70 to 72 generating a plurality of pulses SP, MP, LP having different enable intervals, and a pulse selector 74 selecting any one of the plurality of pulses SP, MP, LP with a detection signal DET to be outputted as a discharge enable signal DC_EN.

The pulse generators 70 to 72 may have a plurality of pulse generators, e.g., a short pulse generator 70 generating a short pulse SP, a middle pulse generator 71 generating a middle pulse MP, and a long pulse generator 72 generating a long pulse LP. Here, with respect to the middle pulse, the short pulse SP is a pulse having an enable interval narrower than the middle pulse MP, and the long pulse LP is a pulse having an enable interval broader than the middle pulse.

The pulse generators 70 to 72 generates pulses SP, MP, LP in response to a control signal DC_ENO enabled in normal driving after over-driving, and a normal drive enable signal controlling enable of the normal driving or the like may be used as the control signal DC_ENO.

Figure 8:
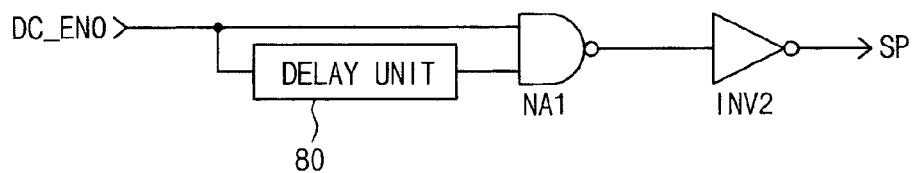
FIG. 8 is a circuit diagram showing an embodiment of a short pulse generator 70 of FIG. 7.

Representatively, the configuration of the short pulse generator 70 will be described. As shown in FIG. 8, the short pulse generator 80 may include a delay unit 80 delaying a control signal DC_ENO; a NAND gate NA1 NAND combining the control signal DC_ENO and an output of the delay unit 80; and an inverter INV2 inverting an output of the NAND gate NA1 to be outputted as a short pulse SP. Here, the delay unit 80 may include an inverter chain and the like.

The other pulse generators 71, 72 may be configured so that the delay amounts of delay units 80 are different from each other in the same configuration as the short pulse generator 70. That is, the delay unit provided to the middle pulse generator 71 may have a delay amount smaller than the delay unit 80 provided to the short pulse generator 70, and the delay unit provided to the long pulse generator 72 may have a delay amount greater than the delay unit provided to the middle pulse generator 71.

The pulse selector 74 selects any one of the pulses SP, MP, LP to be outputted as a discharge enable signal DC_EN in response to a detection signal outputted from the voltage detector 32. When three voltage detectors 32 are provided, and detection signals DET_LOW, DET_MIDDLE, DET_HIGH are outputted from the respective voltage detectors 32, the pulse selector may have a configuration shown in FIG. 9.

Figure 9:
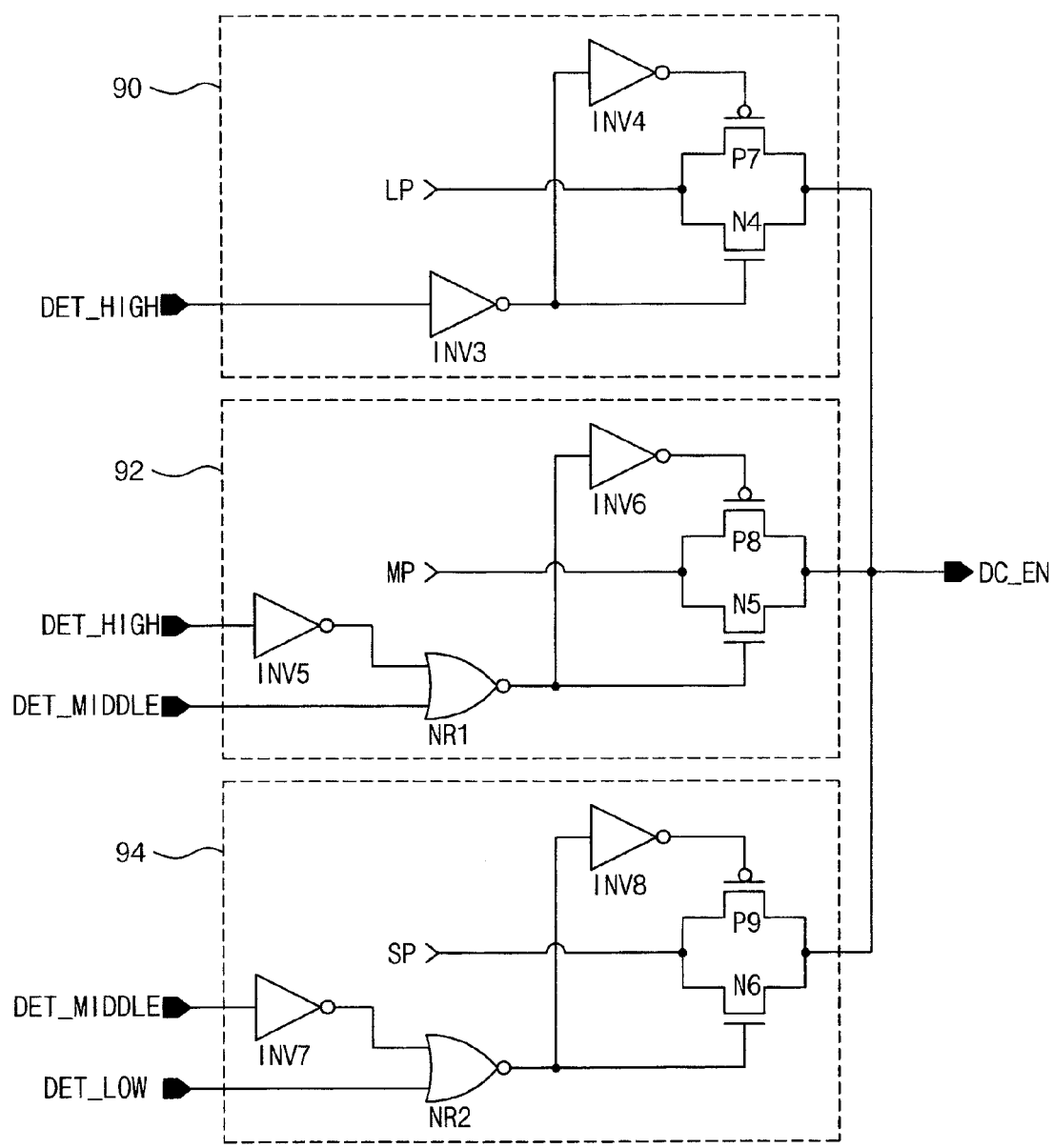
FIG. 9 is a circuit diagram showing an embodiment of a pulse selector 74 of FIG. 7.

Referring to FIG. 9, the pulse selector 74 may include a long pulse transmitter 90 selectively transmitting a long pulse LP as a discharge enable signal DC_EN in response to a detection signal DET_HIGH; a middle pulse transmitter 92 selectively transmitting a middle pulse MP as a discharge enable signal DC_EN in response to detection signals DET_HIGH, DET_MIDDLE; and a short pulse transmitter 94 selectively transmitting a short pulse SP as a discharge enable signal DC_EN in response to detection signals DET_MIDDLE, DET_LOW.

Here, the long pulse transmitter 90 may include an inverter INV3 inverting a detection signal DET_HIGH; an inverter INV4 inverting an output of the inverter INV3; and a transmission gate configured with P7 and N4 switching the transmission of a long pulse LP as a discharge enable signal DC_EN depending on the states of an output of the inverter INV3 and an output of the inverter INV4.

The middle pulse transmitter 92 may include an inverter INV5 inverting a detection signal DET_HIGH; a NOR gate NR1 NOR combining an output of the inverter INV5 and a detection signal DET_MIDDLE; an inverter INV6 inverting an output of the NOR gate NR1; and a transmission gate configured with P8 and N5 switching the transmission of a middle pulse MP as a discharge enable signal DC_EN depending on the states of an output of the inverter INV6 and an output of the NOR gate NR1.

The short pulse transmitter 94 may include an inverter INV7 inverting a detection signal DET_MIDDLE; a NOR gate NR2 NOR combining an output of the inverter INV7 and a detection signal DET_LOW; an inverter INV8 inverting an output of the NOR gate NR2; and a transmission gate configured with P9 and N6 switching the transmission of a short pulse SP as a discharge enable signal DC_EN depending on the states of an output of the inverter INV8 and an output of the NOR gate NR2.

When the detection signals DET_HIGH, DET_MIDDLE, DET_LOW have information on an over-drive voltage VOVER at the power-up interval, i.e., when the detection signals DET_HIGH, DET_MIDDLE, DET_LOW are all high levels, the pulse selector 74 having such a configuration outputs a discharge enable signal DC_EN in a disable state.

When the detection signals DET_HIGH, DET_MIDDLE, DET_LOW have information an over-drive voltage VOVER having a level lower than the reference level after the power-up interval, i.e., when the detection signal DET_LOW is a low level, and the detection signals DET_HIGH, DET_MIDDLE are high levels, the pulse selector 74 selects the short pulse to be outputted as a discharge enable signal DC_EN.

When the detection signals DET_HIGH, DET_MIDDLE, DET_LOW have information on an over-drive voltage VOVER having a middle level that is a reference level, i.e., when the detection signals DET_MIDDLE, DET_LOW are low levels, and the detection signal DET_HIGH is a high level, the pulse selector 74 selects the middle pulse MP to be outputted as a discharge enable signal DC_EN.

When the detection signals DET_HIGH, DET_MIDDLE, DET_LOW have information on an over-drive voltage VOVER having a level higher than the reference level, i.e., when the detection signals DET_HIGH, DET_MIDDLE, DET_LOW are all low levels, the pulse selector 74 selects the long pulse LP to be outputted as a discharge enable signal DC_EN.

Referring back to FIG. 3, the discharge unit 36 discharges a normal drive voltage VNOR in response to the discharge enable signal DC_EN so that the normal drive voltage VNOR is adjusted to correspond to the level of a normal drive reference voltage VREFN.

Figure 10:
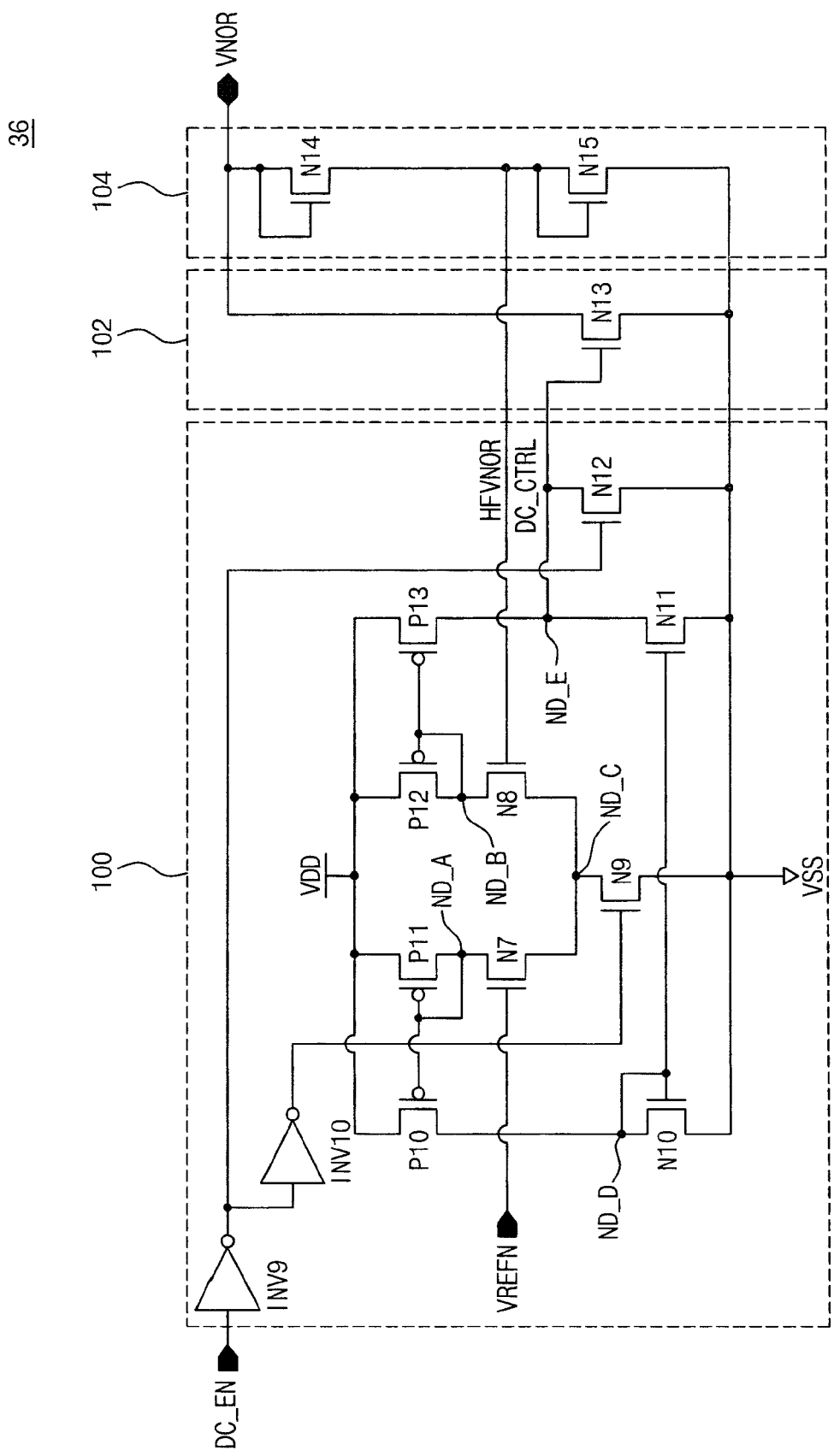
FIG. 10 is a circuit diagram showing an embodiment of a discharge unit 36 of FIG. 3.

As an example, as shown in FIG. 10, the discharge unit 36 may include a comparator 100 comparing a half normal drive voltage HFVNOR with a normal drive reference voltage VREFN to output a control signal DC_CTRL having a state corresponding to the compared result while a discharge enable signal DC_EN is enabled; a pull-down unit 102 selectively pulling down a normal drive voltage VNOR depending on a state of the control signal DC_CTRL; and a divider 104 dividing the normal drive voltage VNOR to generate a half normal drive voltage HFVNOR. Here, the normal drive reference voltage VREFN corresponds to a target level of the half normal drive voltage HFVNOR.

The comparator 100 may include an inverter INV9 inverting a discharge enable signal DC_EN; an inverter INV10 inverting an output of the inverter INV9; PMOS transistors P10, P11 selectively pulling up nodes ND_D, ND_A to a power voltage VDD level depending on the potential of the node ND_A; PMOS transistors P12, P13 selectively pulling up nodes ND_B, ND_E to the power voltage VDD level; an NMOS transistor N7 switching connection between the nodes ND_A, ND_C in response to a normal drive reference voltage VREFN; an NMOS transistor N8 switching connection between the nodes ND_B, ND_C in response to a half normal drive voltage HFVNOR; an NMOS transistor N9 selectively pulling down the node ND_C to a ground voltage VSS level in response to an output of the inverter INV9; NMOS transistors N10, N11 selectively pulling down nodes ND_D and ND_E to the ground voltage VSS level depending on the potential of the node ND_D; and an NMOS transistor N12 selectively pulling down the node ND_E to the ground voltage VSS level in response to an output of the inverter INV9.

When the discharge enable signal DC_EN is a high level (here, the high level means an enable state), the comparator 100 having such a configuration compares the potential difference between a normal drive reference voltage VREFN and a half normal drive voltage HFVNOR. When the half normal drive voltage HFVNOR is higher than the normal drive reference voltage VREFN, the comparator 100 outputs a control signal DC_CTRL in an enable state to the node ND_E. When the discharge enable signal DC_EN is a low level (here, the low level means a disable state), the control signal DC_CTRL is disabled by the NMOS transistor N12.

The pull-down unit 102 may include an NMOS transistor N13 selectively pulling down a normal drive voltage VNOR to the ground voltage VSS level in response to the control signal DC_CRTL.

The divider 104 may include two NMOS transistors N14, N15 dividing a normal drive voltage VNOR into half normal drive voltage HFVNOR.

Figure 11A:
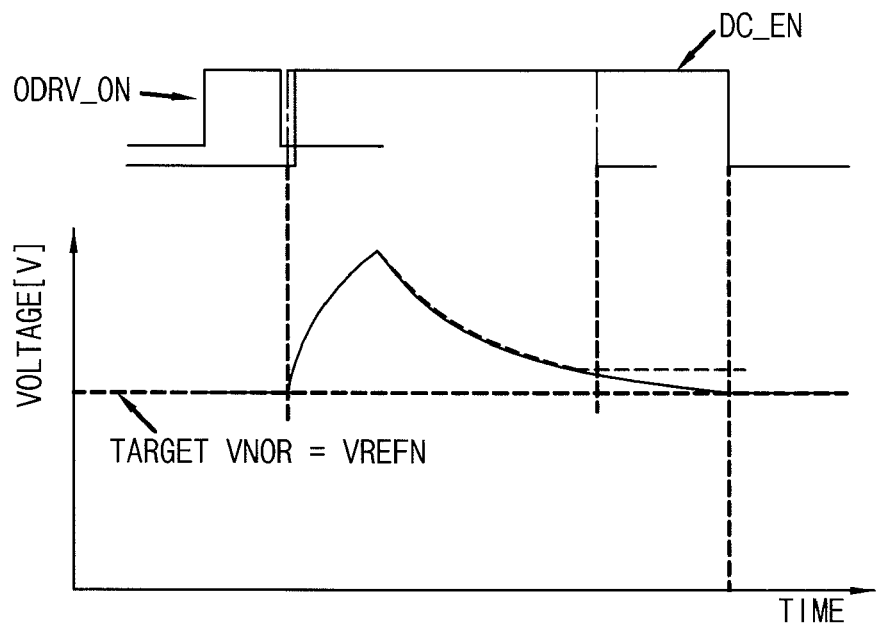
FIGS. 11a and 11b are waveform diagrams illustrating a discharge operation depending on a level of an over-drive voltage VOVER in the semiconductor memory device according to the present invention.

Hereinafter, the operation of the semiconductor memory device according to the present invention will be described in detail with reference to FIGS. 11a and 11b.

First of all, referring to FIG. 11, when an over-drive voltage VOVER is supplied in a state higher than an over-drive reference voltage VREFO that is a target level during an over-driving interval, i.e., an interval at which an over-drive enable signal ODRV_ON are enabled, the level of a normal drive voltage VNOR sharply rises at a normal driving interval corresponding to the level of the over-drive voltage VOVER.

At this time, in the prior art, when a discharge interval, i.e., an interval at which a discharge enable signal DC_EN is enabled, is fixed, the normal drive voltage VNOR is not discharged up to a normal drive reference voltage VREFN that is a target level due to the short discharge interval as shown by a dotted line, and thus, the normal drive voltage VNOR may be maintained as a state higher than the level of the normal drive reference voltage VREFN.

However, in the semiconductor memory device according to the present invention, when the level of an over-drive voltage VOVER is sensed, and the level of the over-drive voltage VOVER is higher than the level of the over-drive reference voltage VREFO, the interval, at which the discharge enable signal DC_EN is enabled, is set to be long (e.g., a long pulse LP is outputted as the discharge enable signal DC_EN), so that the normal drive voltage VNOR can be discharged up to the level of the normal drive reference voltage VREFN.

Figure 11B:
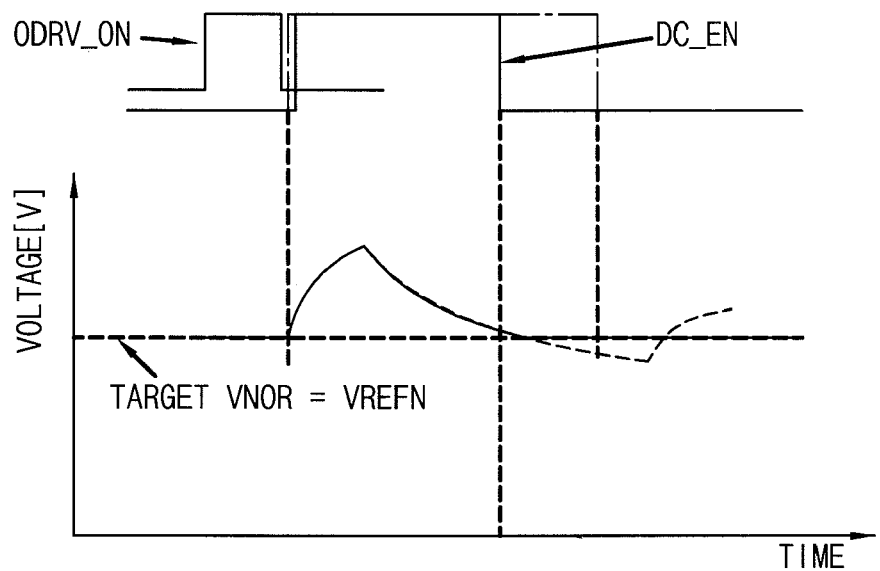

Referring to FIG. 11b, when the over-drive voltage VOVER is supplied in a state lower than the over-drive reference voltage VREFO during an interval at which the over-drive enable signal ODRV_ON are enabled, the level of the normal drive voltage VNOR gently rises at the normal driving interval corresponding to the level of the over-drive voltage VOVER.

At this time, in the prior art, when the interval, at which the discharge enable signal DC_EN is enabled, is fixed, the normal drive voltage VNOR is discharged below the level of the normal drive reference voltage VREFN due to the long discharge interval as shown by a dotted line, and therefore, a ringing phenomenon may occur.

However, in the semiconductor memory device according to the present invention, when the level of an over-drive voltage VOVER is sensed, and the level of the over-drive voltage VOVER is lower than the level of the over-drive reference voltage VREFO, the interval, at which the discharge enable signal DC_EN is enabled, is set to be short (e.g., a short pulse SP is outputted as the discharge enable signal DC_EN), so that the normal drive voltage VNOR can be discharged only up to the level of the normal drive reference voltage VREFN.

As described above, the semiconductor memory device according to the present invention has a configuration in which, when over-driving and normal driving at a specific node are consecutively performed, a normal drive voltage VNOR is discharged up to a target level in order to reduce a change in the level of the normal drive voltage VNOR due to the over-driving.

At this time, the over-drive voltage VOVER supplied in the over-driving may be changed by external environment such as PVT (Process, Voltage, Temperature) and the like. The level of the normal drive voltage VNOR may be changed depending on the level fluctuation of the over-drive voltage VOVER. That is, when the over-drive voltage VOVER is higher than the over-drive reference voltage VREFO, the increment of the level of the normal drive voltage VNOR is increased. When the over-drive voltage is lower than the over-drive reference voltage VREFO, the increment of the level of the normal drive voltage VNOR is decreased.

In this case, in the semiconductor memory device, a discharge amount of the normal drive voltage VNOR is appropriately adjusted by sensing the level of the over-drive voltage VOVER, so that it is possible to prevent the level of the normal drive voltage VNOR from being changed due to the over-driving, and a node to be driven can be maintained as the level of the normal drive reference voltage VREFN during a normal driving interval. As an embodiment, the semiconductor memory device according to the present invention has a configuration in which, when a normal drive voltage VNOR is higher than an over-drive reference voltage VREFO, a discharge time for the normal drive voltage VNOR is appropriately increased, and when the normal drive voltage VNOR is lower than the over-drive reference voltage VREFO, the discharge time for the normal drive voltage VNOR is appropriately decreased.

In the semiconductor memory device according to the present invention, since the increment of the level of the normal drive voltage VNOR is appropriately discharged by sensing the level of the over-drive voltage VOVER, it is not necessary for separately tuning to adjust the level of the normal drive voltage VNOR. Accordingly, costs and time can be reduced.

Particularly, the semiconductor memory device having the aforementioned configuration according to the present invention can be applied to a pull-up driver of a sensing amplifier sensing and amplifying a bit line pair.

Figure 12:
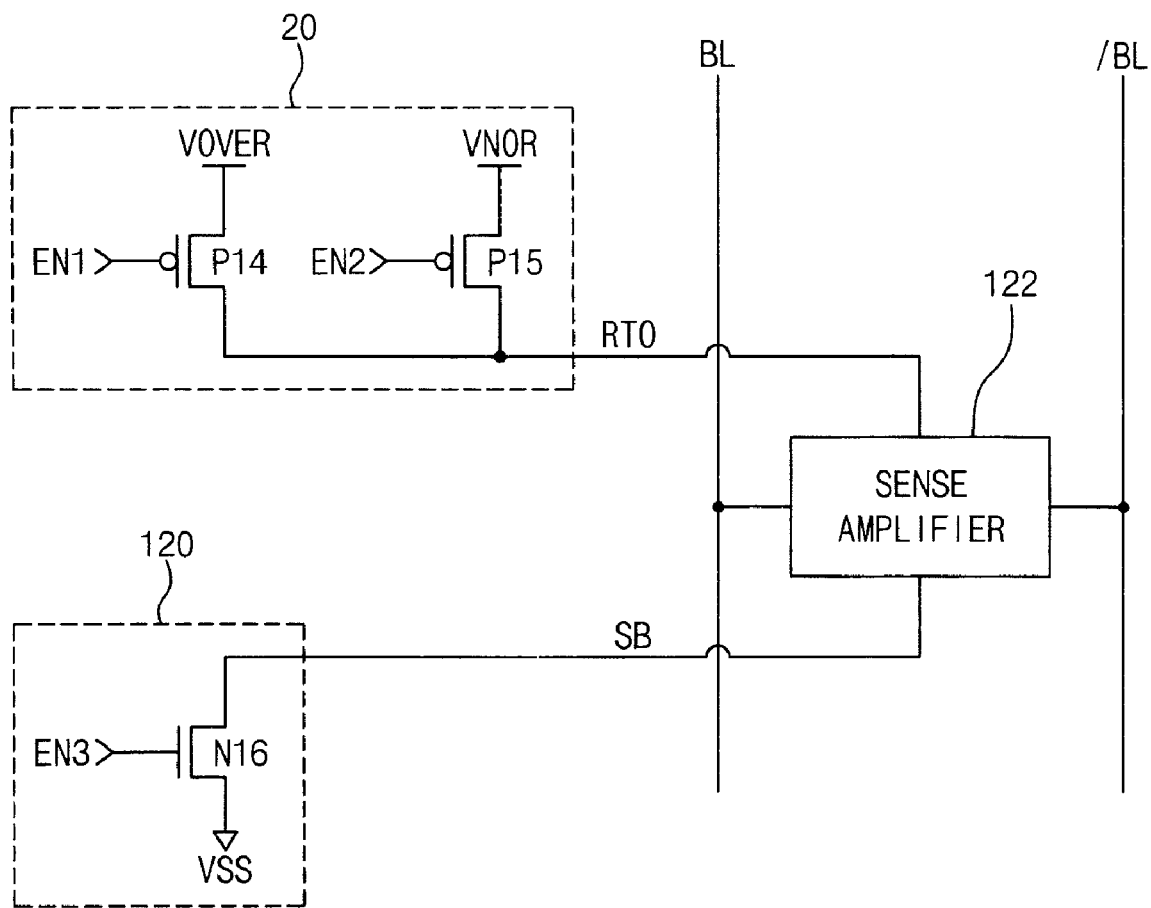
FIG. 12 is a circuit diagram showing an embodiment in which the semiconductor memory device is applied to a pull-up driver of a sensing amplifier 122 sensing and amplifying a bit line pair BL, /BL according to the present invention.

Specifically, referring to FIG. 12, a predetermined potential difference is generated between a bit line pair BL, /BL in an operation of a read or write, a sensing amplifier 122 senses and amplifies the potential difference using a pull-up drive voltage supplied from a pull-up drive node RTO and a pull-down drive voltage supplied from a pull-down drive node SB.

At this time, a driver 20 supplying a pull-up drive voltage to the pull-up drive node RTO may include a PMOS transistor P14 pulling up the pull-up drive node RTO to the level of an over-drive voltage VOVER in response to an enable signal EN1, and a PMOS transistor P15 pulling up the pull-up drive node RTO to the level of a normal drive voltage VNOR in response to an enable signal EN2. Here, the enable signal EN1 is first enabled, and the enable signal EN2 is then enabled after a predetermined time. A power voltage VDD may be used as the over-drive voltage VOVER, and a core voltage VCORE may be used as the normal drive voltage VNOR.

A driver 120 supplying a pull-down drive voltage to the pull-down drive node SB may include an NMOS transistor N16 pulling down the pull-down drive node SB to a ground voltage VSS level in response to an enable signal EN3. Here, the enable signal EN3 is enabled at the time when the enable signal is enabled, and disabled at the time when the enable signal EN2 is disabled.

Similarly, when the semiconductor memory device according to the present invention is applied to the pull-up driver 20 of the sensing amplifier sensing and amplifying the potential difference between the bit line pair BL, /BL, a normal drive voltage VNOR is appropriately discharged in normal driving by sensing the level of an over-drive voltage VOVER, so that it is possible to prevent the level of the normal drive voltage VNOR from being changed due to the over-drive voltage VOVER, thereby securing reliability of a pull-up operation of the sensing amplifier 122.

According to the present invention, level fluctuation of a normal drive voltage due to over-driving can be substantially prevented or at least minimized.

Further, according to the present invention, a predetermined node can be substantially maintained as a target level of normal driving during a normal driving interval after over-driving at the node.

Furthermore, according to the present invention, a level increment of the normal drive voltage due to over-driving is appropriately discharged, so that time and costs due to the level adjustment of the normal drive voltage can be reduced.

In addition, according to the present invention, a normal drive voltage are prevented from being fluctuated due to an over-drive voltage when the over-drive voltage and the normal drive voltage are sequentially supplied to a pull-up driving node of a sensing amplifier sensing and amplifying a bit line pair, thereby securing reliability of a pull-up operation of the sensing amplifier.

Those skilled in the art will appreciate that the specific embodiments disclosed in the foregoing description may be readily utilized as a basis for modifying or designing other embodiments for carrying out the same purposes of the present invention. Those skilled in the art will also appreciate that such equivalent embodiments do not depart from the spirit and scope of the invention as set forth in the appended claims.

What is claimed is:

1. A semiconductor memory device, comprising:
   a driver configured to output a drive signal, to over-drive the drive signal with an over-drive voltage having a level higher than a normal drive voltage, and then to drive normally the drive signal with the normal drive voltage; and
   a drive voltage adjuster configured to detect a level of the over-drive voltage and to compensate for a change in the level of the normal drive voltage caused by the over-driving such that the normal drive voltage is adjusted to correspond to the level of the normal drive reference voltage.

2. The semiconductor memory device as set forth in claim 1, wherein the drive voltage adjuster discharges the normal drive voltage in response to the detected level of the over-drive voltage in the normal driving of the drive signal to compensate for the change in the level of the normal drive voltage.

3. The semiconductor memory device as set forth in claim 2, wherein the drive voltage adjuster adjusts a discharge time of the normal drive voltage in response to the detected level of the over-drive voltage.

4. The semiconductor memory device as set forth in claim 3, wherein the drive voltage adjuster previously sets a plurality of discharge interval corresponding to various reference levels, detects the level of the normal drive voltage to select one of the discharge intervals that corresponds to the level of the normal drive voltage, and then discharges the normal drive voltage during the selected discharge interval.

5. The semiconductor memory device as set forth in claim 1, wherein the normal drive voltage is an internal voltage, and the over-drive voltage is an external voltage.

6. The semiconductor memory device as set forth in claim 5, wherein the internal voltage is a core voltage, and the external voltage is a power voltage.

7. The semiconductor memory device as set forth in claim 1, wherein the drive signal outputted from the driver is provided to a pull-up drive node of a sensing ampler sensing and amplifying a potential difference between a bit line pair.

8. A semiconductor memory device, comprising:
   a driver outputting a drive signal, over-driving the drive signal with an over-drive voltage having a level higher than a normal drive voltage, and then normal driving the drive signal with the normal drive voltage;
   a discharge interval setting unit detecting the level of the over-drive voltage to output a discharge enable signal having an enable interval corresponding to the detected level of the over-drive voltage; and
   a discharge unit selectively discharging the normal drive voltage to adjust the normal drive voltage as a target level during the enable interval of the discharge enable signal.

9. The semiconductor memory device as set forth in claim 8, wherein the discharge interval setting unit outputs the discharge enable signal having a first enable interval when the detected over-drive voltage is a first level, outputs the discharge enable signal having an enable interval broader than the first enable interval when the detected over-drive voltage is higher than the first level, and outputs the discharge enable signal having an enable interval narrower than the first enable interval when the detected over-drive voltage is lower than the first level.

10. The semiconductor memory device as set forth in claim 8, wherein the discharge interval setting unit comprises: a voltage detector detecting the level of the over-drive voltage; a pulse generator generating a plurality of pulse, each pulse having a different enable interval within the normal driving operation interval of the driver; and a pulse selector selecting any one of the pulses corresponding to the detected level of the over-drive voltage to be outputted as the discharge enable signal.

11. The semiconductor memory device as set forth in claim 10, wherein the voltage detector detects and divides the level of the over-drive voltage for the enable interval of each pulse to output a plurality of detection signals corresponding to the respective enable interval of each pulse, and enables and outputs a detection signal corresponding to the enable interval of one of the pulses at which the level of the over-drive voltage is formed among the plurality of detection signal.

12. The semiconductor memory device as set forth in claim 10, wherein the pulse generator generates the pulses using a normal drive enable signal controlling enablement of the normal driving of the drive signal.

13. The semiconductor memory device as set forth in claim 10, wherein the pulse selector selects a first pulse of the pulses to be subsequently outputted as the discharge enable signal when the detected over-drive voltage is at a first voltage level, selects a second pulse having the respective enable interval broader than the first pulse of the pulses to be subsequently outputted as the discharge enable signal when the detected over-drive voltage is higher than the first voltage level, and selects a third pulse having the respective enable interval narrower than the first pulse of the pulses to be subsequently outputted as the discharge enable signal when the detected over-drive voltage is lower than the first level.

14. The semiconductor memory device as set forth in claim 9, wherein the discharge unit compares the normal drive voltage with the target level while the discharge enable signal is enabled, and discharges the normal drive voltage up to the target level when the level of the normal drive voltage is higher than the target level.

15. The semiconductor memory device as set forth in claim 14, wherein the discharge unit comprises:
   a comparator comparing the normal drive voltage with a normal drive reference voltage having the target level to be outputted as a control signal having a state corresponding to the compared result while the discharge enable signal is enabled; and
   a pull-down unit selectively pulling down the normal drive voltage depending on a state of the control signal.

16. The semiconductor memory device as set forth in claim 8, wherein the normal drive voltage is an internal voltage, and the over-drive voltage is an external voltage.

17. The semiconductor memory device as set forth in claim 16, wherein the internal voltage is a core voltage, and the external voltage is a power voltage.

18. The semiconductor memory device as set forth in claim 8, wherein the drive signal outputted from the driver is provided to a pull-up drive node of a sensing amplifier sensing and amplifying a potential difference between a bit line pair.

19. A semiconductor memory device, comprising:
a driver outputting a drive signal, over-driving the drive signal with an over-drive voltage having a level higher than a normal drive voltage, and subsequently normal driving the drive signal with the normal drive voltage;
a voltage detector detecting a level of the over-drive voltage; and
a discharge controller setting a discharge interval corresponding to the detected level of the over-drive voltage and selectively discharging the normal drive voltage during the set discharge interval to adjust the normal drive voltage to a normal drive voltage target level.

20. The semiconductor memory device as set forth in claim 19, wherein the voltage detector compares the over-drive voltage with an over-drive reference voltage target level to detect the over-drive voltage level.

21. The semiconductor memory device as set forth in claim 19, wherein the voltage detector comprises:
a divider dividing the over-drive voltage level; and
a comparator comparing the divided over-drive voltage level with an over-drive reference voltage having a divided voltage target level to output a comparator detection signal having information on the level of the divided over-drive voltage level.

22. The semiconductor memory device as set forth in claim 19, wherein the discharge controller comprises:
a pulse generator generating a plurality of pulse, each pulse having a different enable interval within the normal driving interval;
a pulse selector selecting any one of the pulses with the detection signal to be outputted as the discharge enable signal; and
a discharge unit selectively discharging the normal drive voltage to adjust the normal drive voltage to the target level during the enable interval of the discharge enable signal.

23. The semiconductor memory device as set forth in claim 22, wherein the pulse generator generates the pulses using a normal drive enable signal controlling enablement of the normal driving voltage.

24. The semiconductor memory device as set forth in claim 22, wherein the pulse selector selects a first pulse of the pulses when the detection signal corresponds to when the over-drive voltage is at a first level, selects a second pulse having an enable interval broader than the first pulse of the pulses when the detecting signal corresponds to when the over-drive voltage is higher than the first level, and selects a third pulse having an enable interval narrower than the first pulse of the pulses when the detection signal corresponds to when the over-drive voltage is lower than the first level.

25. The semiconductor memory device as set forth in claim 22, wherein the discharge unit compares the normal drive voltage with the target level while the discharge enable signal is enabled, and discharges the normal drive voltage up to the normal drive voltage target level when the level of the normal drive voltage is higher than the normal drive voltage target level.

26. The semiconductor memory device as set forth in claim 25, wherein the discharge unit comprises:
a comparator comparing the normal drive voltage with a normal drive reference voltage corresponding to the normal drive voltage target level to output as a control signal corresponding to the compared result while the discharge enable signal is enabled; and
a pull-down unit selectively pulling down the normal drive voltage in response to a state of the control signal.

27. The semiconductor memory device as set forth in claim 19, wherein the normal drive voltage is an internal voltage, and the over-drive voltage is an external power voltage.

28. The semiconductor memory device as set forth in claim 27, wherein the normal drive voltage is a core voltage, and the over-drive voltage is a power voltage.

29. The semiconductor memory device as set forth in claim 19, wherein the drive signal outputted from the driver is provided to a pull-up drive node of a sensing amplifier sensing and amplifying a potential difference between a bit line pair.

* * * * *